United States Patent
Lee et al.

(10) Patent No.: US 8,570,126 B1
(45) Date of Patent: Oct. 29, 2013

(54) CONTACTLESS SWITCH WITH STATIONARY VANE

(71) Applicant: Eaton Corporation, Cleveland, OH (US)

(72) Inventors: Davin R Lee, Milwaukee, WI (US); Mark A Juds, New Berlin, WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 13/630,355

(22) Filed: Sep. 28, 2012

(51) Int. Cl.
*H01H 9/00* (2006.01)
(52) U.S. Cl.
USPC .......................................... 335/205; 335/207
(58) Field of Classification Search
USPC ................................................. 335/205–207
See application file for complete search history.

(56) References Cited

U.S. PATENT DOCUMENTS

| | | | | |
|---|---|---|---|---|
| 4,150,348 | A * | 4/1979 | Foltz | 335/4 |
| 4,221,941 | A * | 9/1980 | Genovese | 200/457 |
| 4,321,442 | A * | 3/1982 | Tanaka et al. | 200/308 |
| 4,489,297 | A * | 12/1984 | Haydon et al. | 335/207 |
| 4,697,053 | A * | 9/1987 | Lockard | 200/437 |
| 4,803,317 | A * | 2/1989 | Sutoh et al. | 200/438 |
| 5,053,591 | A * | 10/1991 | Theurer | 200/315 |
| 6,124,771 | A * | 9/2000 | Kim et al. | 335/4 |
| 6,339,201 | B1 * | 1/2002 | Balaban et al. | 200/339 |
| 6,566,619 | B2 * | 5/2003 | Gillman et al. | 200/339 |
| 6,576,855 | B2 * | 6/2003 | Levendis et al. | 200/339 |
| 6,867,680 | B1 | 3/2005 | Kulle | |
| 6,919,523 | B1 * | 7/2005 | Lai | 200/402 |
| 7,026,565 | B1 * | 4/2006 | Lee | 200/339 |
| 7,105,762 | B1 * | 9/2006 | Lee | 200/449 |
| 7,576,293 | B2 * | 8/2009 | Nagai et al. | 200/339 |
| 7,679,362 | B2 * | 3/2010 | Koski | 324/207.2 |
| 7,952,044 | B2 * | 5/2011 | Lee | 200/339 |
| 8,138,872 | B2 * | 3/2012 | Yoshihara et al. | 335/281 |
| 2010/0289484 | A1 * | 11/2010 | Quinn | 324/207.2 |
| 2011/0114465 | A1 | 5/2011 | Gillmann et al. | |

OTHER PUBLICATIONS

C&K Components; OEM Product Development Solutions for the Self-Read Market; Hall-Effect Contactless Sensing Analog Rocker Switches; Mar. 19, 2010.
Otto; Direct Industry—The Virtual Industrial Exhibition; Hall Effect Rocker Switch (undated, known to exist on Feb. 22, 2012).

* cited by examiner

*Primary Examiner* — Elvin G Enad
*Assistant Examiner* — Lisa Homza
(74) *Attorney, Agent, or Firm* — Benesch Friedlander Coplan & Aronoff LLP

(57) ABSTRACT

A switch includes a switch housing, and a button moveably mounted to the housing. A profile is disposed on the underside of the button and has a profile contour that provides the tactile feel of the button as it is engaged by the user. A spring biased plunger has one end that engages the profile contour. A printed circuit board is mounted to the housing and includes a magnet sensor. A magnet holder includes at least one magnet. A vane interrupter has at least one passage having an opening proximate to a magnetic sensor. The magnet holder is moveably mounted to the housing such that the magnet is selectively moveable at least partially within the passage to a position where the magnet can be detected by the sensor.

20 Claims, 10 Drawing Sheets

CONTACTLESS SWITCH WITH STATIONARY VANE

PRIORITY CLAIM

This application claims priority to U.S. Provisional Patent Application No. 61/646,368, filed May 14, 2012, which is incorporated by reference as if fully set forth herein.

FIELD OF THE INVENTION

This application is directed to electrical switching mechanisms.

BACKGROUND

Electrical switches, including rocker-type switches, can operate by detecting switch position, which in turn can be dictated by a user's engagement of a moveable switch button. Detection of deliberate actuation by the user is desirable, as is differentiation of deliberate actuation of such a button from button movement that may not be intended by the user.

SUMMARY

According to one aspect of the present teachings, a switch includes a switch housing, and a button moveably mounted to the housing. A profile is disposed on the underside of the button and has a profile contour that provides the tactile feel of the button as it is engaged by the user. A spring biased plunger has one end that engages the profile contour. A printed circuit board is mounted to the housing and includes a magnet sensor. A magnet holder includes at least one magnet. A vane interrupter has at least one passage having an opening proximate to a magnetic sensor. The magnet holder is moveably mounted to the housing such that the magnet is selectively moveable at least partially within the passage to a position where the magnet can be detected by the sensor.

BRIEF DESCRIPTION OF THE DRAWINGS

In the accompanying drawings, structures are illustrated that, together with the detailed description provided below, describe aspects of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
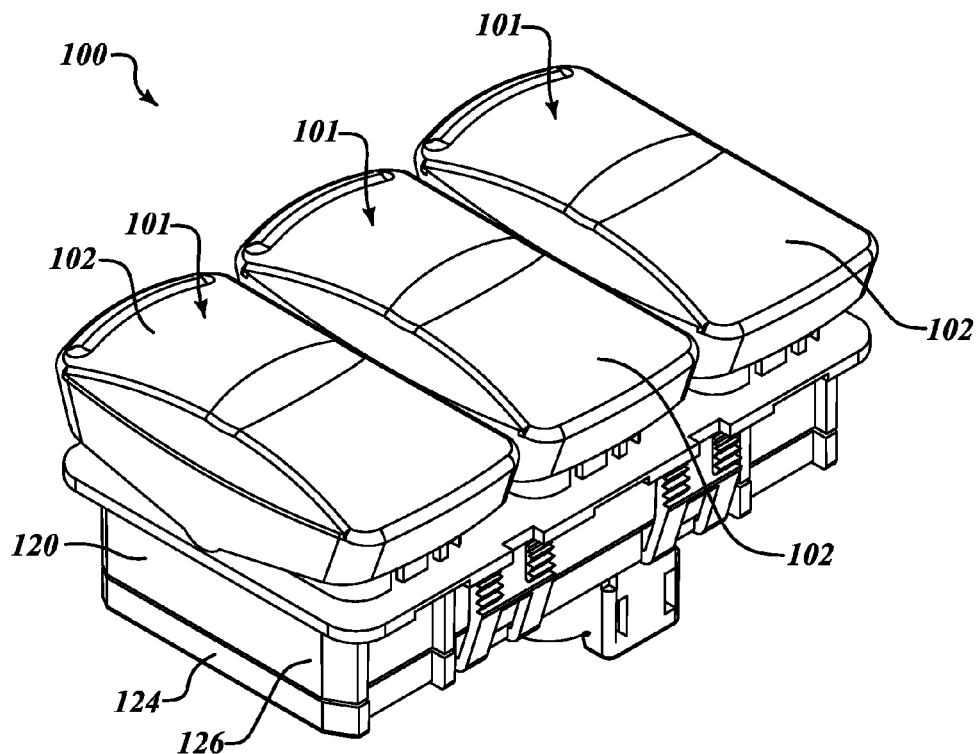
FIG. 1 is a perspective view of a multi-switch assembly according to the present disclosure.

FIG. 1 illustrates a multi-switch assembly 100 according to the present disclosure. The illustrated assembly 100 has three switches 101, all three of which share similar internal mechanisms and electronics beneath buttons 102, which serves as an interface for a user. In the illustrated example, buttons 102 are rocker-type buttons. However other types of buttons may be implemented according to the present teachings. Further, any one or more switches 101 in an assembly may be implemented according to the present disclosure, and the internal mechanisms and electronics need not be identical.

Figure 2:
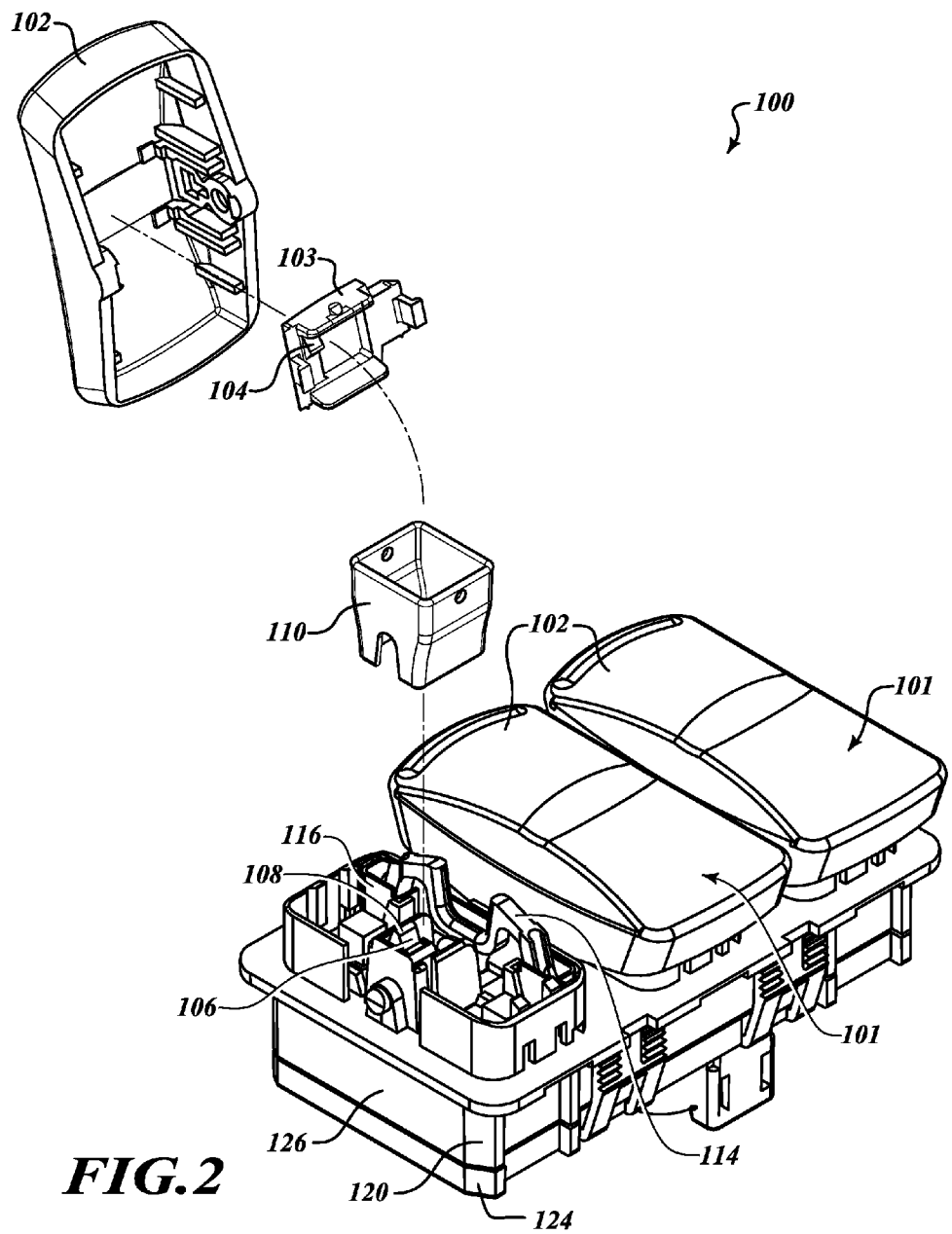
FIG. 2 is a partially exploded view of the multi-switch assembly shown in FIG. 1.

FIG. 2 illustrates a partially exploded view of assembly 100 of FIG. 1. A switch profile member 103 is disposed on the underside of button 102. Switch profile member 103 has a profile contour 104 is disposed on the underside of button 102 and interacts with a plunger 106 that is biased toward profile contour 104. The contact made by end 108 of biased plunger 106 against profile contour 104 dictates the tactile response of button 102 felt by the user. The illustrated example shows but one example contour 104, and other contours may be implemented according to the present teachings. Several forms of switching action may be provided by selecting a corresponding profile contour 104. Such switching action can include, for example, momentary, sustained, 2 position or 3 position.

Figure 3:
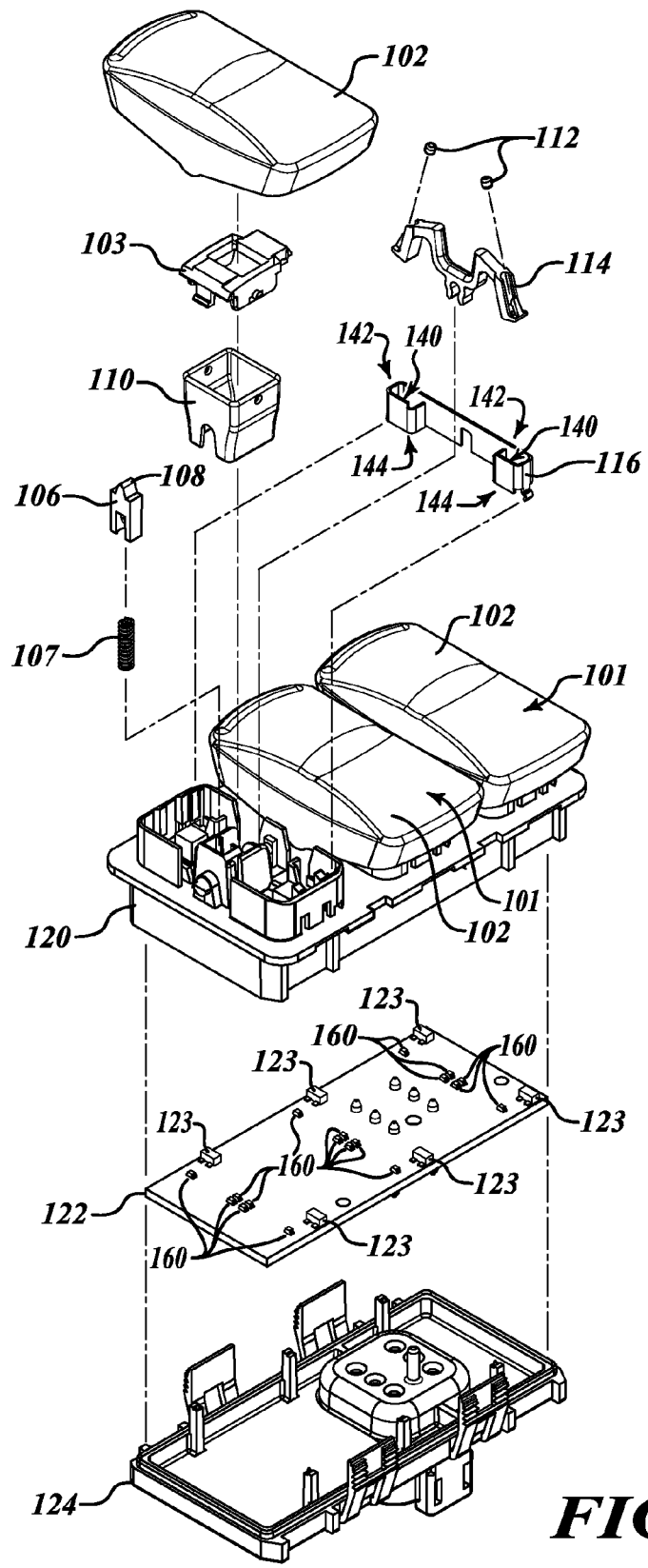
FIG. 3 illustrates an exploded view of the multi-switch assembly shown in FIG. 1.

With reference to FIG. 3 a multi-switch assembly 100 includes buttons 102, a profile member 103, a plunger 106, a plunger spring 107, a plunger seal 110, magnets 112, a magnet holder 114, a vane interrupter 116, a frame 120, a printed circuit board ("PCB") assembly 122 and a back cover 124. Plunger seal 110 is a dust-resistant boot that reduces dust and dirt contamination of the plunger 106 and plunger spring 107. According to one aspect of the present teachings, plunger seal 110 can include an elastic material.

PCB assembly 122 includes electromagnetic sensors 123. According to one aspect of the present teachings, the sensors are Hall Effect sensors 123 configured to detect magnets 112. Hall Effect sensors 123 act as transducers responsive to the magnetic field of magnets 112, which can be permanent magnets according to one aspect of the present teachings. According to one aspect of the present teachings, back cover 124 and frame 120 together form a housing 126 in which PCB assembly 122 is mounted. When housing 126 is assembled, PCB assembly 122 is mounted within housing 126, and sensors 123 are mounted within housing, disposed beneath magnets 112. Other electromagnetic sensors may be implemented, such as any sensor that can detect electromagnetic field strength. In other aspects, the sensors may be electromagnetic field sensors that act as transducers generating a signal proportional to one or more aspects of the electromagnetic fields generated by magnets. According to other aspects of the present teachings, housings may be formed of a single piece, or more than two pieces. In addition, the PCB assembly 122 may be mounted to the housing in different ways and in different orientations. In one non-limiting example, PCB assembly 122 can be mounted underneath the housing.

Figure 4:
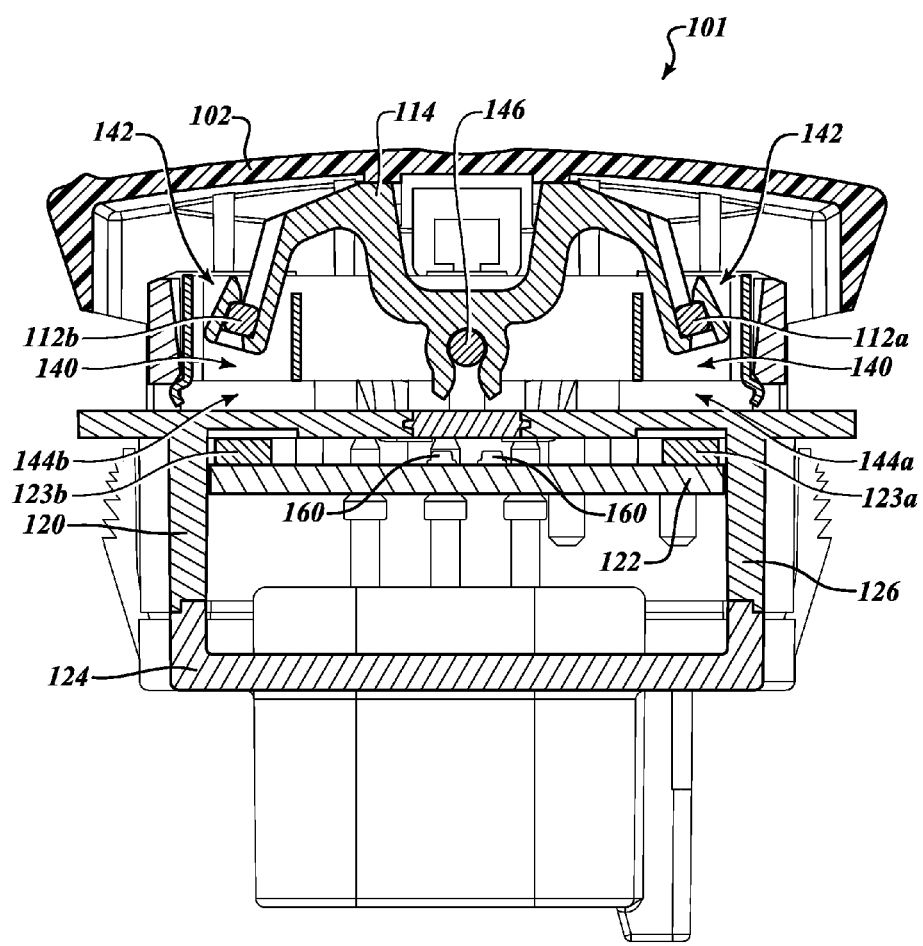
FIGS. 4-6 are sectional views of the multi-switch assembly shown in FIG. 1 in the center, partially down, and fully down position, showing the magnet holder, magnets, sensors, a ferrous vane.

With reference to FIG. 4, a switch 101 of assembly 100 in its center, or neutral position. Hall-effect sensors 123a and 123b are mounted on PCB assembly 122, which in turn is mounted to housing 126. Hall Effect sensors 123a, 123b are mounted underneath frame 120, which separates sensors 123a, 123b from permanent magnets 112a, 112b in holder 114. Magnets 112a, 112b are disposed inside passages 140 of ferrous vane interrupter 116 having a rectangular cross-section. Passages 140 have openings 142 distal to sensors 123 relative to proximate openings 144. When magnets 112a, 112b are disposed within passages 140, between openings 142 and 144, vane interrupter 116 attenuates the magnetic field of permanent magnets 112a, 112b at Hall-effect sensors 123a, 123b to a value lower than would otherwise be felt without the presence of vane interrupter 116. In the illustrated position, sensors 123a, 123b and the connected electronics on PCB assembly 122 detect that the switch is not in an activated position.

Figure 5:
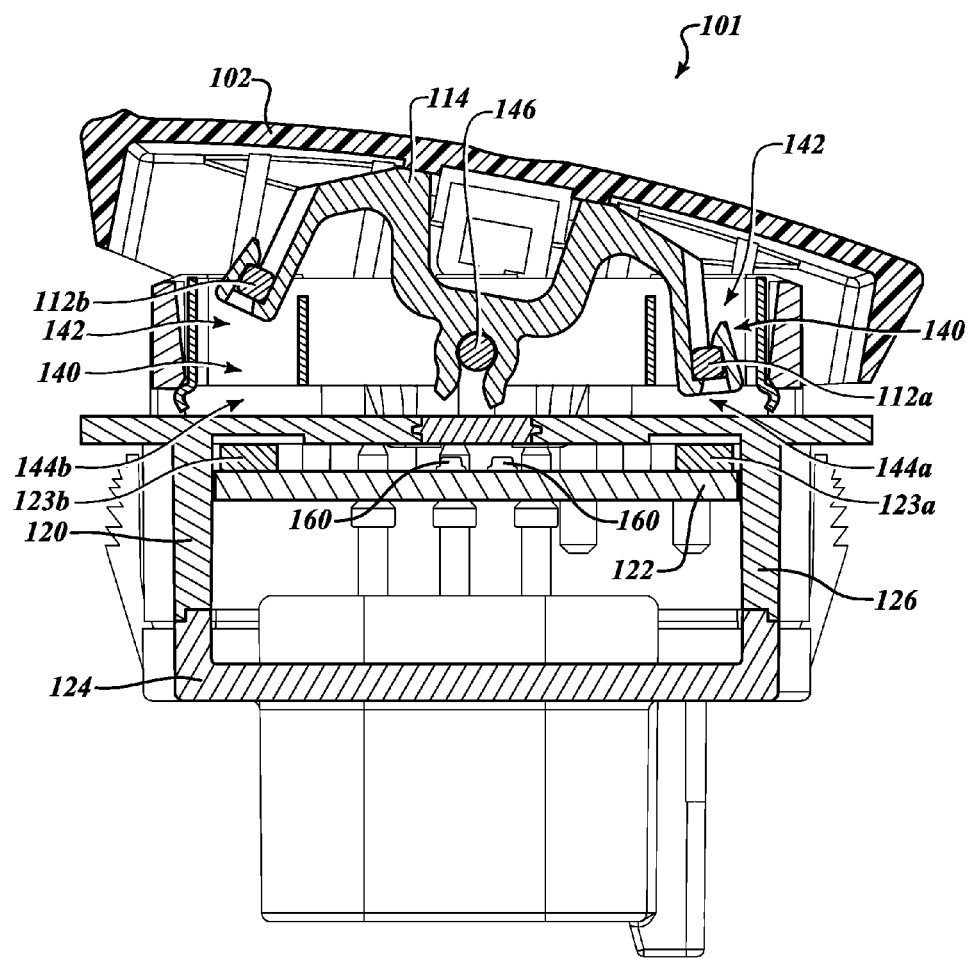

As button 102 is rotated clockwise from the center position shown FIG. 4 to the partially depressed position shown in FIG. 5, rocker button 102 pushes magnet holder 114 causing it to rotate about pin 146. Magnet 112a has moved closer to Hall-effect sensor 123a, and closer to opening 144. As magnets 112a, 112b move closer to openings 144a, 144b, the attenuating effect of vane interrupter 116 diminishes. As a result of the change in position, the intensity of the magnetic field at sensor 123a rises more rapidly than would otherwise occur without vane interrupter 116. This permits sensor 123a to detect an activation of switch 101 before switch 101 is fully rotated in the clockwise direction to the position shown in FIG. 6.

Figure 6:
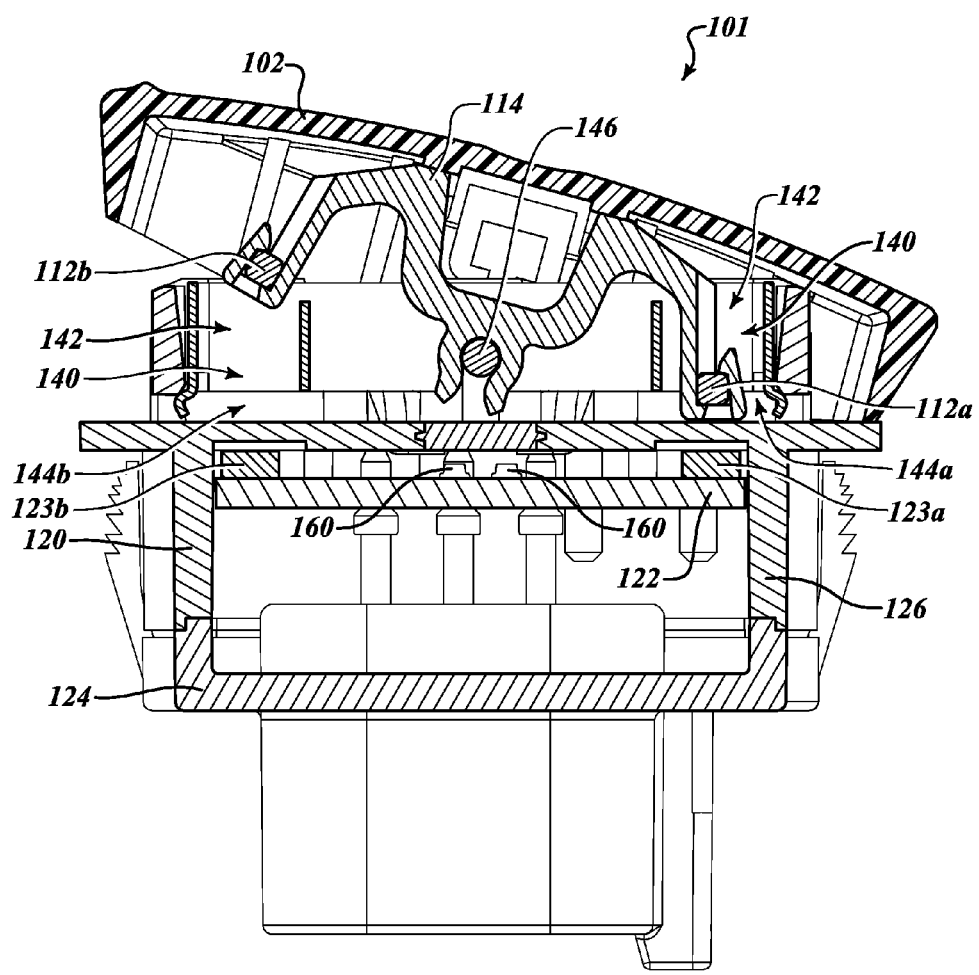

FIG. 6 shows switch 101 at its terminal position at the end of its travel in the clockwise direction. In this position, vane interrupter 116 has little effect on the magnetic field surrounding magnet 112a, and the magnetic field at sensor 123a is at its highest intensity. In the illustrated position, the magnetic field at sensor 123b is at its lowest intensity as magnet 112b is at its furthest position distal to sensor 123b.

Rocker button 102 of switch 101 illustrated in FIG. 6 can be rotated in the opposite direction. When moved in the counterclockwise direction, magnet 112a moves inside of passage 140 of vane interrupter 116, which attenuates the magnetic field of magnet 112a and causes the field detected by sensor 123a to drop much more rapidly than without vane 116, until sensor 123a detects switch 101 to be deactivated before button 102 of switch 101 reaches its "center" position. The user can further depress button 102 in the counterclockwise direction to another actuated position where magnet 112b is sufficiently close to sensor 123b to detect actuation. Like the clockwise rotation of switch 101, the counterclockwise rotation can result in sensor 123b detecting the magnetic field of magnet 112b before magnet 112b reaches a terminal position closest to sensor 123b. As with the end of travel in the clockwise position, when the switch reaches the end of travel in the counterclockwise direction, magnet 112a is at its furthest position from sensor 123a when magnet 112b is at its terminal position closest to sensor 123b. According to an aspect of the present teachings, no contact between Hall-effect sensors 123 and magnets 112 is necessary for switch 101 to function. Further, none of magnets 112 or holder 114 must penetrate the switch housing in order to effectuate switching.

Figure 7:
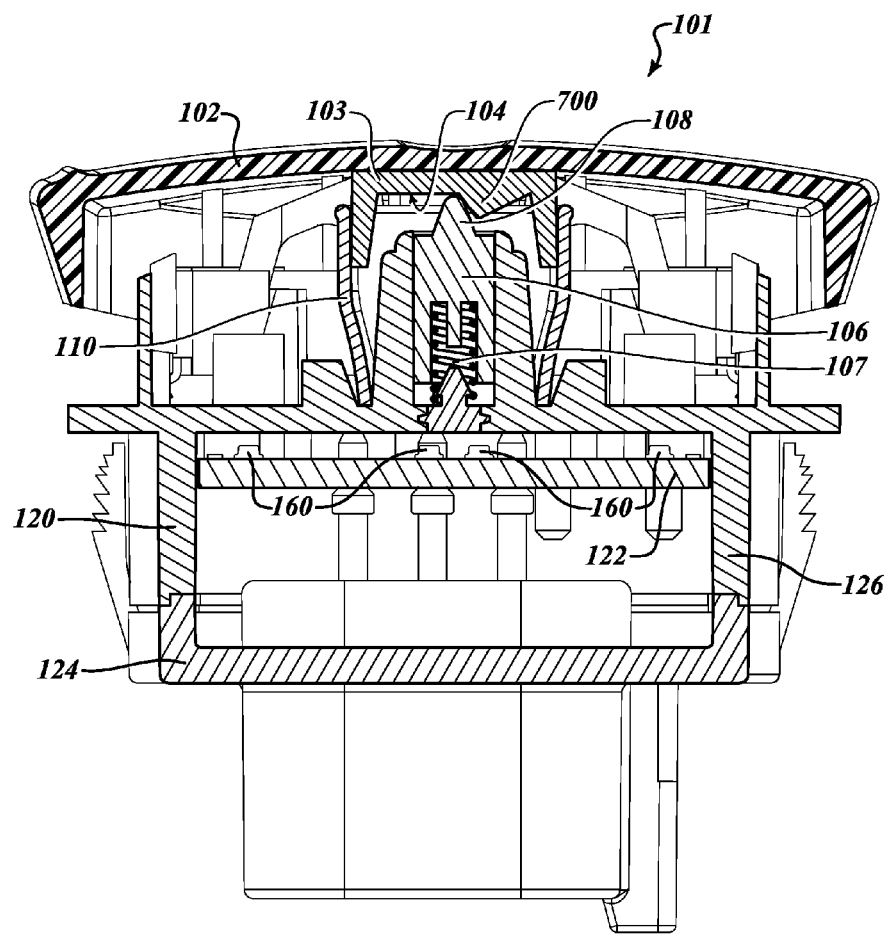
FIG. 7 is an alternative section view of the multi-switch assembly shown in FIG. 1 showing the plunger and profile.

With reference to FIG. 7, plunger 106 is biased against profile member 103 by spring 107. Tapered end 108 of plunger 106 makes contact against profile contour 104 of profile member 103. In the illustrated example, protrusion 700 causes the button to provide a clicking sensation to the user when the button is depressed in the counterclockwise direction from the illustrated position. Other profile contours can be utilized according to the present disclosure.

The illustrated profile member 103 can be substituted with another profile member having a different shape profile contour than the illustrated profile contour 104. Switch profile members 103 may be selected according to a user's preferred switching behavior for a particular switch 101. Combinations of different switch profile members 103 may be used in assemblies such as assembly 100. Profile members 103 can be secured to the underside of button 102 by snap-fitting, molding, welding or a variety of other methods. Such construction permits the use of a common button 102 and with a variety of different profile members 103. Reference may be made to U.S. Pat. Nos. 7,026,565 and 7,952,044, which are incorporated by reference as if fully set forth herein.

Figure 8:
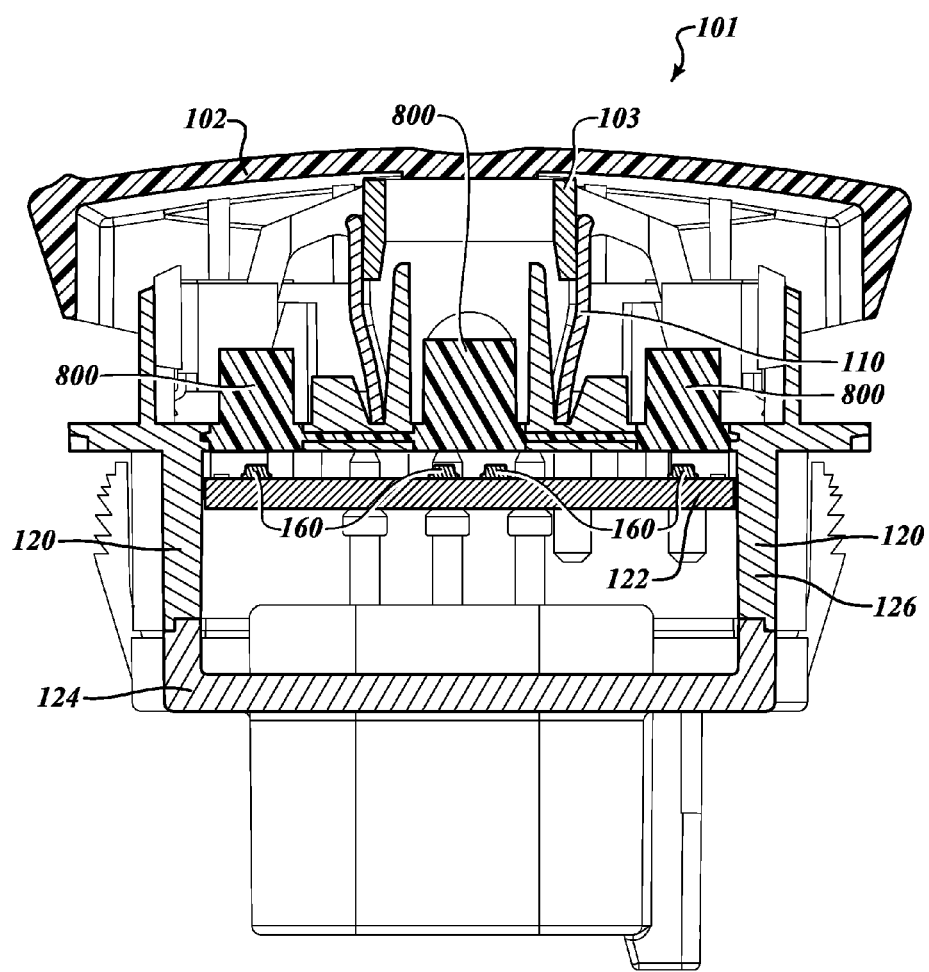
FIG. 8 is a sectional view of a switch according to the present disclosure.

With reference to FIG. 8, light emitting diodes (LEDs) 160 can be affixed to PCB assembly 122. LEDs 160 emit light through rocker button 102 by passing the light through light pipes 800 constructed from a transparent material that directs the emitted light toward button 102. Light pipes 800 can be molded directly into frame 120 or can be a separate discrete component.

Figure 9:
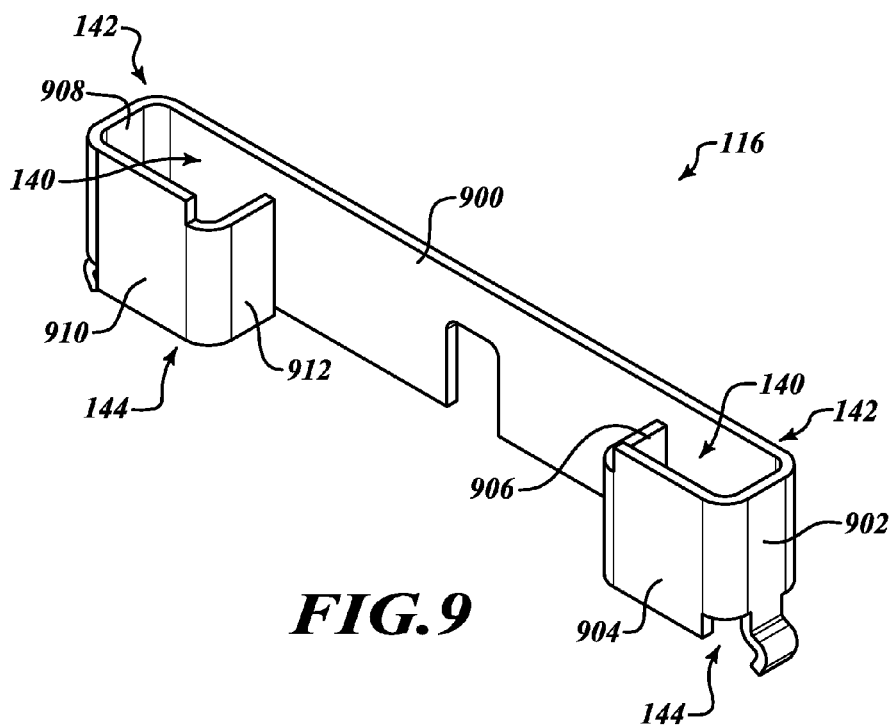
FIG. 9 is a view of a vane interrupter.

With reference to FIG. 9, vane interrupter 116 is formed from sheet metal to have a plurality of walls forming two passages 140. First wall 900 forms part of both passages 140. One of passages 140 is partially formed by second wall 902, third wall 904 and fourth wall 906, and the other passage is partially formed by fifth wall 908, sixth wall 910 and seventh wall 912. Passages 140 almost completely surround magnets that travel within passages 140. However, a vane interrupter need not completely surround the magnets to have the desired effect. In one aspect of the present teachings, a vane interrupter can partially surround magnets that are moveable toward and away from Hall Effect sensors. Further, while the illustrated passages 140 have a rectangular cross-sectional shape, other shapes may be implemented, such as circular cross sections, triangular cross-sections, and several other possible cross-sectional shapes. According to one aspect of the present teachings, vane interrupter 116 may be constructed from iron. In another aspect, vane interrupter 116 may be made of any magnetic material, including but not limited to magnetic stainless steel.

Figure 10:
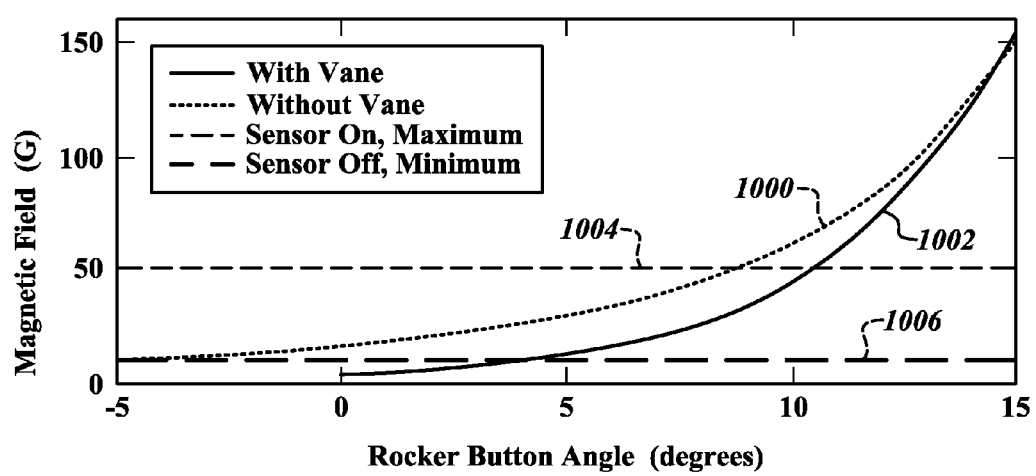
FIG. 10 is a graph of simulation of the magnetic field versus rocker button angle for a switch according to the present disclosure.

With reference to FIG. 10, according to one aspect of the present teachings, a graph of magnetic field measured in Gauss (G) versus rocker button rotation angle from a simulation of a switch, for example one configured such as switch 101, with and without a stationary vane interrupter, such as interrupter 116. Line 1000 reflects the response without a vane interrupter and line 1002 reflects the response with a vane interrupter. Line 1004 illustrated the maximum magnetic field intensity required at the sensor to activate the switch, while line 1006 is the minimum value of magnetic field intensity required to deactivate the switch. Without the vane interrupter, the maximum magnetic field intensity required at the sensor to activate the switch is achieved at about 9 degrees of rotation, whereas with the vane interrupter, the maximum magnetic field intensity required at the sensor to activate the switch is achieved at about 11 degrees of rotation, a difference of about 2 degrees. Further, without the vane interrupter, the minimum magnetic field intensity required at the sensor to deactivate the switch is achieved at about −5 degrees of rotation, whereas with the vane interrupter, the maximum magnetic field intensity required at the sensor to deactivate the switch is achieved at about 5 degrees of rotation, a difference of about 10 degrees. Thus, with the vane interrupter, the switch need only travel about 7 degrees between levels of magnetic field required to activate and deactivate the switch, whereas with the vane interrupter, the switch must travel about 14 degrees to attain these field intensities. The arrangement without the vane interrupter necessitates a greater separation between the magnet and the sensor to effectively function. In other aspects, the sensors may be electromagnetic field sensors that act as transducers generating a signal proportional to one or more aspects of the electromagnetic fields generated my magnets, and positions may be resolved by, for example, software that determines positions based on signal strength and activates the switch based on such determined position.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Additionally, to the extent that the terms "on" or "onto" are used in the specification or the claims, it is intended to additionally mean "in," "into," or "near." Furthermore, to the extent the terms "connect" or "mount" (or variations thereof) are used in the specification or claims, it is intended to mean not only "directly connected to," but also "indirectly connected to" such as connected through another component or components.

While aspects of the present teachings have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details and illustrative examples shown and described. Accordingly, departures may be made from such details without departing from the spirit or scope of the applicant's general inventive concept.

What is claimed is:

1. A switch comprising:
a switch housing;
a button moveably mounted to the housing;
a profile disposed between the button and housing and having a profile contour;
a plunger disposed between the profile and housing and having a first end proximate to the profile contour;
a printed circuit board mounted to the housing and including a magnet sensor;
a vane interrupter having a passage proximate to the magnet sensor; and
a magnet holder, including at least one magnet, moveably mounted to the housing such that the magnet is selectively moveable at least partially within the passage to a first position distal to the sensor and a second position proximate to the sensor.

2. The switch of claim 1, wherein the vane interrupter includes a first wall, second wall, third wall and fourth wall, the first, second, third and fourth wall defining the passage.

3. The switch of claim 2, wherein the vane interrupter includes a ferromagnetic material.

4. The switch of claim 1, wherein the vane interrupter includes a ferromagnetic material.

5. The switch of claim 1, further comprising a plunger spring disposed between the housing and plunger, the plunger spring biasing the plunger toward the profile.

6. The switch of claim 1, wherein the vane interrupter is fixed relative to the housing, and the magnetic holder is rotatably mounted to the housing.

7. The switch of claim 1, the housing including a frame and a back cover, the frame disposed between the magnet sensor and the magnet holder.

8. The switch of claim 1, wherein the second position is a terminal position, the magnet spaced from the magnet sensor when the magnet holder is in the second position.

9. A switch comprising:
a switch housing;
a button moveably mounted to the housing;
a magnet sensor mounted to the housing;
a vane interrupter having a passage proximate to the magnet sensor; and
a magnet holder including at least one magnet and moveably mounted to the housing such that the magnet is selectively moveable at least partially within the passage to a first position distal to the sensor and a second position proximate to the sensor relative to the first position.

10. The switch of claim 9, wherein the vane interrupter includes a first wall, second wall, third wall and fourth wall, a portion of the first wall, the second wall, the third wall and fourth wall defining the passage.

11. The switch of claim 9, wherein the vane interrupter includes a ferromagnetic material.

12. The switch of claim 9, wherein the vane interrupter is fixed relative to the housing, and the magnet holder is rotatably mounted to the housing.

13. The switch of claim 9, the housing including a frame and a back cover, the frame disposed between the magnet sensor and the magnet holder.

14. The switch of claim 9, further comprising:
a profile disposed between an underside of the button and housing and having a profile contour; and,
a plunger disposed between the profile and housing and having a first end proximate to the profile contour.

15. The switch of claim 14, further comprising a plunger spring disposed between the switch housing and plunger, the plunger spring biasing the plunger toward the profile.

16. The switch of claim 14, wherein the second position is a terminal position, the magnet spaced from the magnet sensor when the magnet holder is in the second position.

17. A switch comprising:
a housing;
a button moveably mounted to the housing;
a first and second Hall effect sensor mounted to the housing;
a vane interrupter having a first and second passage, the first passage having an opening proximate to the first Hall effect sensor, the second passage having an opening proximate to the second Hall effect sensor; and a magnet holder rotatably mounted to the housing and including a first and second magnet, wherein the magnet holder is selectively moveable at least partially within the first passage to a first position distal to the first sensor and a second position proximate to the first sensor relative to the first position, and such that the second magnet is selectively moveable at least partially within the second passage to a third position distal to the second sensor and a fourth position proximate to the second sensor relative to the third position.

18. The switch of claim 17, further comprising:
a profile disposed at the underside of the button and having a profile contour; and,
a plunger disposed between the profile and housing and having a first end proximate to the profile contour.

19. The switch of claim 17, wherein the second position is a terminal position, the first magnet spaced from the first magnet sensor when the magnet holder is in the second position.

20. The switch of claim 19, wherein the fourth position is a terminal position, the second magnet spaced from the second magnet sensor when the magnet holder is in the fourth position.

* * * * *